(12) United States Patent
Harako et al.

(10) Patent No.: US 12,244,083 B2
(45) Date of Patent: Mar. 4, 2025

(54) ELECTRICAL CONNECTING APPARATUS

(71) Applicant: KABUSHIKI KAISHA NIHON MICRONICS, Tokyo (JP)

(72) Inventors: Shou Harako, Tokyo (JP); Noboru Otabe, Tokyo (JP); Hiroshi Kamiya, Tokyo (JP); Yoshiyuki Fukami, Tokyo (JP); Shogo Mizutani, Tokyo (JP)

(73) Assignee: KABUSHIKI KAISHA NIHON MICRONICS, Tokyo (JP)

( * ) Notice: Subject to any disclaimer, the term of this patent is extended or adjusted under 35 U.S.C. 154(b) by 538 days.

(21) Appl. No.: 17/432,550

(22) PCT Filed: Dec. 13, 2019

(86) PCT No.: PCT/JP2019/048940
§ 371 (c)(1),
(2) Date: Aug. 20, 2021

(87) PCT Pub. No.: WO2020/183832
PCT Pub. Date: Sep. 17, 2020

(65) Prior Publication Data
US 2022/0149549 A1    May 12, 2022

(30) Foreign Application Priority Data
Mar. 11, 2019  (JP) ................. 2019-043733

(51) Int. Cl.
*H01R 12/52*  (2011.01)
*G01R 1/073*  (2006.01)
*G01R 31/28*  (2006.01)

(52) U.S. Cl.
CPC ......... *H01R 12/52* (2013.01); *G01R 1/07342* (2013.01); *G01R 31/2889* (2013.01)

(58) Field of Classification Search
CPC .......... H01R 12/52; H01R 12/91; H01R 3/08; H01R 12/718; G01R 1/07342;
(Continued)

(56) References Cited

U.S. PATENT DOCUMENTS 4,806,111 A * 2/1989 Nishi .................... H01R 4/028
439/74
5,245,276 A * 9/1993 Hashinaga ........ H01L 21/67396
324/756.01
(Continued)

FOREIGN PATENT DOCUMENTS

CN       203466320 U    3/2014
CN       107104298 A    8/2017
(Continued)

OTHER PUBLICATIONS

Machine English translation JP 2010-218977 (Year: 2010).*
(Continued)

*Primary Examiner* — Michael L Dignan
(74) *Attorney, Agent, or Firm* — BACON&THOMAS,PLLC

(57) ABSTRACT

An electrical connecting apparatus according to the present disclosure is characterized in including a first electrode region in which a liquid metal is filled in a first recessed part that is capable of conducting with a substrate electrode of a first wiring substrate, a second electrode region in which a liquid metal is filled in a second recessed part that is capable of conducting with a substrate electrode of a second wiring substrate opposing the first wiring substrate in a vertical direction, and a connector that causes conduction between the first electrode region and the second electrode region by bringing one end part into contact with the liquid metal of the first electrode region and bringing the other end part into contact with the liquid metal of the second electrode region.

5 Claims, 6 Drawing Sheets

(58) Field of Classification Search
CPC ............ G01R 31/2889; G01R 1/07314; G01R 1/06733; G01R 1/06755; G01R 1/073
See application file for complete search history.

(56) References Cited

U.S. PATENT DOCUMENTS

| | | |
|---|---|---|
| 2006/0145715 A1 | 7/2006 | Salmon |
| 2009/0193652 A1 | 8/2009 | Salmon |
| 2013/0000117 A1 | 1/2013 | Baskaran |

FOREIGN PATENT DOCUMENTS

| | | | | |
|---|---|---|---|---|
| CN | 109239578 A | 1/2019 | | |
| EP | 3309829 A1 | 4/2018 | | |
| JP | 53-112484 A | 9/1978 | | |
| JP | 59-111341 A | 6/1984 | | |
| JP | S61-124071 A | 6/1986 | | |
| JP | S62-295371 A | 12/1987 | | |
| JP | S63-14274 A | 6/1988 | | |
| JP | S63-141274 | * 6/1988 | ............... | H01R 9/09 |
| JP | 1-221877 A | 9/1989 | | |
| JP | H4-095845 A | 3/1992 | | |
| JP | 4-127066 A | 4/1992 | | |
| JP | H5-203670 A | 8/1993 | | |
| JP | 7-85916 A | 3/1995 | | |
| JP | H8-36179 A | 9/1996 | | |
| JP | 2000-036657 A | 2/2000 | | |
| JP | 2009-295707 A | 12/2009 | | |
| JP | 2010003573 A | 1/2010 | | |
| JP | 2010-218977 | * 9/2010 | ............. | H01H 29/16 |
| JP | 2010218977 A | 9/2010 | | |
| JP | 2010218981 A | 9/2010 | | |
| JP | 2012-249155 A | 12/2012 | | |
| JP | 2018064063 A | 4/2018 | | |
| SU | 1758740 A1 | 8/1992 | | |
| TW | 201805634 A | 2/2018 | | |

OTHER PUBLICATIONS

S63-141274 machine English translation (Year: 1988).*
First Office Action dated Nov. 22, 2022 based on Japanese Appln. No. 2019-0043733 with English Translation.
International Search Report and English Translation cited in International Appln. PCT/JP2019048940 dated Jan. 31, 2020.
First Office Action dated Jul. 26, 2023 in corresponding Korean Patent Appln. No. 10-2021-7029622.
First Office Action issued in corresponding Chinese Patent Appln. 201980093681.1 dated Nov. 15, 2023.
Second Official Action dated May 20, 2024 in corresponding Chinese Patent Appln. No. 201980093681.1.

* cited by examiner

ELECTRICAL CONNECTING APPARATUS

CROSS-REFERENCE TO RELATED APPLICATIONS

The present application claims, under 35 USC 119, priority of Japanese Patent Application No. 2019-043733 filed on Mar. 11, 2019.

TECHNICAL FIELD

The present disclosure relates to an electrical connecting apparatus.

BACKGROUND ART

An inspection object such as an integrated circuit formed on a wafer is electrically inspected as to whether it has a predetermined electrical characteristic. Such electrical inspection is performed by using a probe card that electrically connects an electrode terminal of an inspection object with a connection terminal in an electric circuit of an inspection device.

As illustrated in FIG. 6, a probe card 70 of the prior art includes a wiring substrate 72 that is electrically connected with an inspection device (not illustrated), an electrical connecting unit 73 that is disposed on the underside of the wiring substrate 72, a probe substrate 74 that is electrically connected with the wiring substrate 72 through a plurality of connection terminals 731 of the electrical connecting unit 73, and a plurality of contacts 75 that are attached to the lower surface of the probe substrate 74. In order to perform an inspection on an inspection object, the inspection device electrically connects the contacts 75 of the probe substrate 74 with an electrode terminal of the inspection object 76.

In the prior art, the connectors 731 are provided for the electrical connecting unit 73 in order to electrically connect the wiring substrate 72 with the probe substrate 74. An upper end of each of the connectors 731 is electrically connected with an electrode (hereinafter, also referred to as the "upper electrode") 721 on the lower surface of the wiring substrate 72, and a lower end of each of the connectors 731 is electrically connected with an electrode (hereinafter, also referred to as the "lower electrode") 741 on the upper surface of the probe substrate 74.

In order to stabilize the electrical connection between the upper electrode 721 of the wiring substrate 72 and the lower electrode 741 of the probe substrate 74, a good connecting property is required between each of the connectors 731 of the electrical connecting unit 73, and the upper electrode 721 and the lower electrode 741.

Patent Literature 1 discloses a circuit device that includes a circuit substrate having a hole part in the thickness direction of the circuit substrate, in which a liquid metal is disposed in the hole part, and a circuit wiring part having a projecting contact part that contacts the liquid metal. According to the technique described in Patent Literature 1, a stable electrical connecting property is realized by bringing the projecting contact part of the circuit wiring part into contact with the liquid metal disposed in the hole part of the circuit substrate to expand the contact area with respect to the connector region.

CITATION LIST

Patent Literature

Patent Literature 1: JP2018-64063

SUMMARY OF INVENTION

Problem to be Solved

However, a probe card of the prior art has a problem in that a contact area between a connector and electrodes (an upper electrode and a lower electrode) is small, and thus contact resistance becomes large, since tips of the upper end and the lower end of the connector have, for example, conical shapes or the like.

For example, as shown in Patent Literature 1, the contact area can be expanded by bringing the projecting contact part of the circuit wiring part into contact with the liquid metal disposed in the hole part of the circuit substrate. However, a projecting contact part that corresponds to the shape of the hole part in which the liquid metal is disposed must be provided, and thus an electrical connecting structure between the connector and the electrode region becomes complicated.

Furthermore, in order to retain a stable contact property between the electrode terminal of the inspection object and each probe of the probe substrate, the probe card is required to adjust flatness of the probe substrate attached to the probe card, and thus positions of the upper electrode and the lower electrode in the height direction may be dispersed. Furthermore, elastic action in the vertical direction is required when bringing the electrode terminal of the inspection object into contact with the probe. Thus, there is a problem in that stabilization of an electrical connecting property between each connector of the electrical connecting unit and the electrodes (the upper electrode and the lower electrode) is difficult.

Therefore, in view of the problem as described above, the present disclosure intends to provide an electrical connecting apparatus that can realize a stable electrical connecting property by expanding a contact area between an electrode region of a wiring substrate and a connector as compared to the prior art, and suppressing contact resistance.

Means for Solving Problem

In order to solve such problem, an electrical connecting apparatus according to the present disclosure is characterized in including (1) a first electrode region in which a liquid metal is filled in a first recessed part that is capable of conducting with a substrate electrode of a first wiring substrate, (2) a second electrode region in which a liquid metal is filled in a second recessed part that is capable of conducting with a substrate electrode of a second wiring substrate opposing the first wiring substrate, and (3) a connector that causes conduction between the first electrode region and the second electrode region by bringing one end part into contact with the liquid metal of the first electrode region and bringing the other end part into contact with the liquid metal of the second electrode region.

Advantageous Effects of Invention

According to the present disclosure, a stable electrical connecting property can be realized by expanding a contact area between an electrode region of a wiring substrate and a connector, and suppressing contact resistance.

BRIEF DESCRIPTION OF EMBODIMENTS (A) Basic Concept

An embodiment of an electrical connecting apparatus according to the present disclosure will now be described with reference to the drawings.

An electrical connecting apparatus herein is a device for electrically connecting an electrode region that is provided on a first wiring substrate with an electrode region that is provided on a second wiring substrate. Accordingly, the electrical connecting apparatus can be applied to various devices, equipment, and the like. For example, the electrical connecting apparatus can be applied to a circuit device for electrically connecting circuit substrates equipped in a personal computer or the like, a unit for electrically connecting wiring substrates forming a probe card, and the like.

First, the basic concept of an electrical connecting structure between electrode regions of a wiring substrate in an electrical connecting apparatus according to an embodiment will be described with reference to the drawings.

Figure 1:
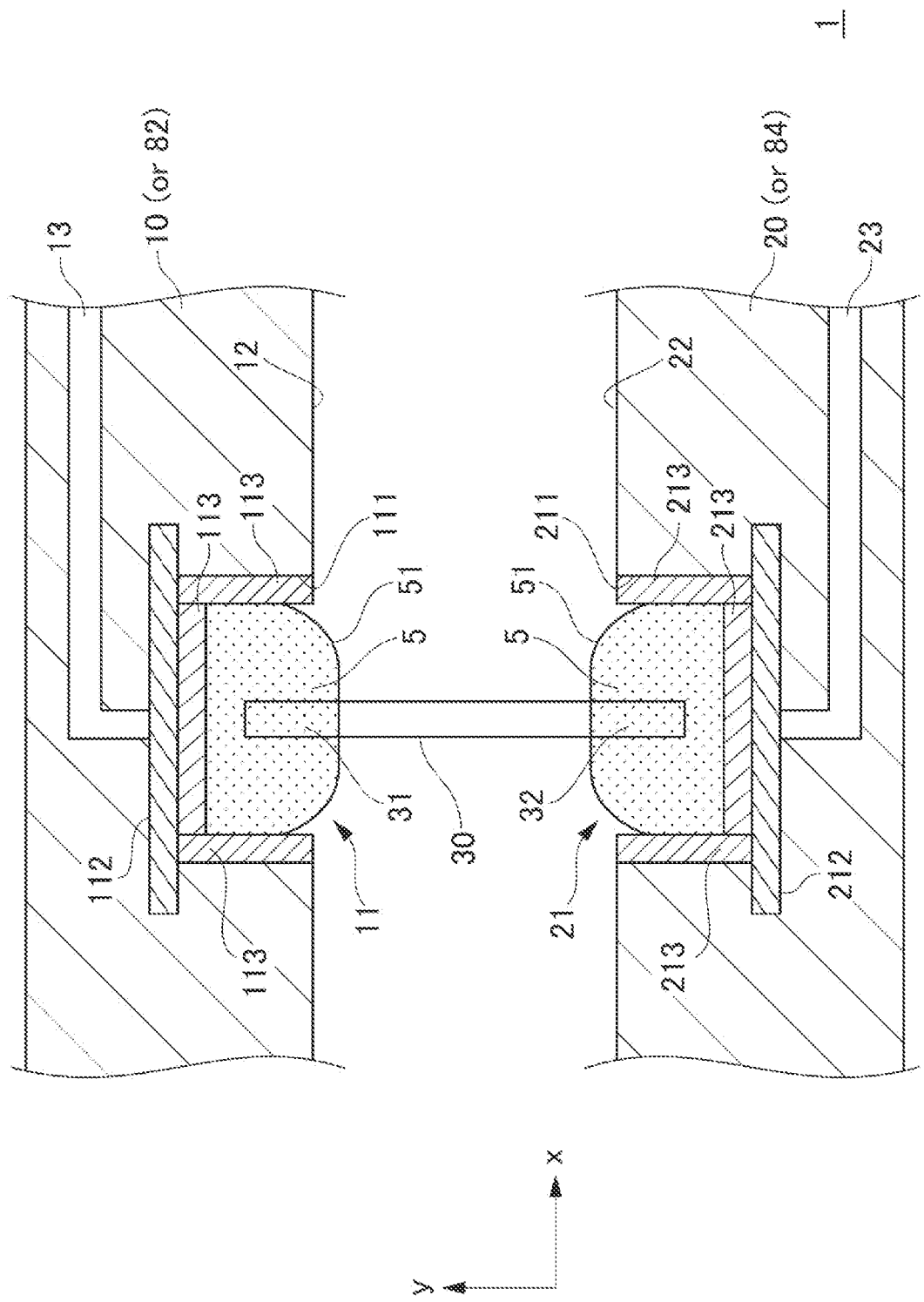
FIG. 1 shows the configuration of an electrical connecting structure between electrode regions of a wiring substrate in an electrical connecting apparatus according to an embodiment.

FIG. 1 shows the configuration of the electrical connecting structure between the electrode regions of the wiring substrate in the electrical connecting apparatus according to the embodiment. FIG. 1 is a sectional view between the electrode regions of the wiring substrate.

As illustrated in FIG. 1, the electrical connecting structure illustrates a structure for electrically connecting an electrode region 11 of a first wiring substrate 10 with an electrode region 21 of a second wiring substrate 20 using a connector 30.

An electric circuit 13 is formed on the first wiring substrate 10, and the electrode region (hereinafter, also referred to as the "upper electrode region") 11 to be electrically connected with the electric circuit 13 is disposed on a lower surface 12 of the first wiring substrate 10.

In the electrode region 11, the lower surface 12 of the first wiring substrate 10 is formed to have a recessed part 111 that is depressed in the thickness direction of the substrate. A liquid metal 5 is filled inside the recessed part 111. In addition, an inner surface of the recessed part 111 of the electrode region 11 (i.e., a wall surface part and an upper bottom part of the recessed part 111) is provided with a metal layer 113 that is formed with a metal material such as, for example, copper and gold.

Furthermore, an upper part of the recessed part 111 in the electrode region 11 is provided with an electrode portion (hereinafter, also referred to as the "upper electrode portion") 112. This upper electrode portion 112 is electrically connected with the electric circuit 13 formed on the first wiring substrate 10.

An electric circuit 23 is formed on the second wiring substrate 20, and the electrode region (hereinafter, also referred to as the "bottom electrode region") 21 to be electrically connected with the electric circuit 23 is disposed on an upper surface 22 of the second wiring substrate 20.

In the electrode region 21, the upper surface 22 of the second wiring substrate 20 is formed to have a recessed part 211 that is depressed in the thickness direction of the substrate, and the liquid metal 5 is filled inside the recessed part 211. In addition, an inner surface of the recessed part 211 of the electrode region 21 (i.e., a wall surface part and a lower bottom part of the recessed part 211) is provided with a metal layer 213 that is formed with a metal material such as, for example, copper and gold.

Furthermore, a lower part of the recessed part 211 in the electrode region 21 is provided with an electrode portion (hereinafter, also referred to as the "lower electrode portion") 212. This lower electrode portion 212 is electrically connected with the electric circuit 23 formed on the second wiring substrate 20.

The liquid metal 5 is preferably in a liquid state in a use environmental temperature of the circuit device. For example, a metal having a melting point at room temperature (for example, about 30° C.) and under is preferably used, and for example, a metal having a melting point at −40° C. to 20° C. is further preferably used. The liquid metal 5 may be one kind of metal, or it may be an alloy that is composed of a plurality of liquid metals. For example, a metal such as gallium (Ga), indium (In), stannum (Sn), nickel (Ni) or the like, or an alloy having these as metallic alloys may be applied to the liquid metal 5. More specifically, a eutectic metal (for example, Galinstan (registered trademark)) of gallium, indium, and stannum may be applied. The metallic composition ratio of the liquid metal composed of a plurality of metals is not particularly limited, and various ratios may be applied.

The recessed part 111 in the electrode region 11 of the first wiring substrate 10 and the recessed part 211 in the electrode region 21 of the second wiring substrate 20 may be filled with the liquid metal 5 having the same metallic composition, or the liquid metal 5 having different metallic compositions may be filled.

The connector 30 is a member for electrically connecting the electrode region 11 of the first wiring substrate 10 with the electrode region 21 of the second wiring substrate 20. The connector 30 is a member that is formed of a conductive material.

An upper part 31 of the connector 30 electrically contacts the liquid metal 5 filled in the recessed part 111 of the first wiring substrate 10, and a lower part 32 of the connector 30 electrically contacts the liquid metal 5 filled in the recessed part 211 of the second wiring substrate 20, thereby realizing an electrical connection between the electrode region 11 of the first wiring substrate 10 and the electrode region 21 of the second wiring substrate 20. In other words, not only one end of the connector 30 contacts the liquid metal 5, but both ends of the connector 30 contact the liquid metal 5 in the electrode regions 11, 21 of each wiring substrate.

In the prior art, as an example of an electrical connecting structure between electrodes using a connector, an electrical connection between electrodes is realized by bringing a tip of the connector into electrical contact with an electrode terminal at one point or multiple points. In such electrical connecting structure, a contact area between the tip of the connector and the electrode terminal is small, and contact resistance is increased. Thus, a stable electrical connecting property between the connector and each electrode terminal is required.

In contrast, in this embodiment, a contact area between the liquid metal 5 and the connector 30 can be expanded, and contact resistance can be suppressed, by bringing both ends of the connector 30 into contact with the liquid metal 5 in the electrode region 11 and the electrode region 21 of each wiring substrate. As a result, the electrical connecting property between the connector 30, and the electrode region 11 and the electrode region 21, can be stabilized.

In addition, as will be described later, by giving characteristics to the shape, the length, and the like of the connector 30, the connector 30 and the liquid metal 5 can be brought into contact in a state receiving buoyancy of the liquid metal 5 in the electrode region 11 and the electrode region 21. Accordingly, a stable electrical connecting property can be retained even if variations may occur in the length of the distance between the electrode region 11 and the electrode region 21.

(B) First Embodiment

A first embodiment of the electrical connecting apparatus according to the present disclosure will now be described in detail with reference to the drawings.

The first embodiment illustrates an embodiment in which the electrical structure between the electrode regions according to the electrical connecting apparatus described above is applied to a probe card to be used for an electrical inspection on an inspection object such as an integrated circuit that is formed on a wafer. In the following, descriptions will be made by also referring to FIG. 1.

(B-1) Configuration of First Embodiment

[Probe Card]

Figure 2:
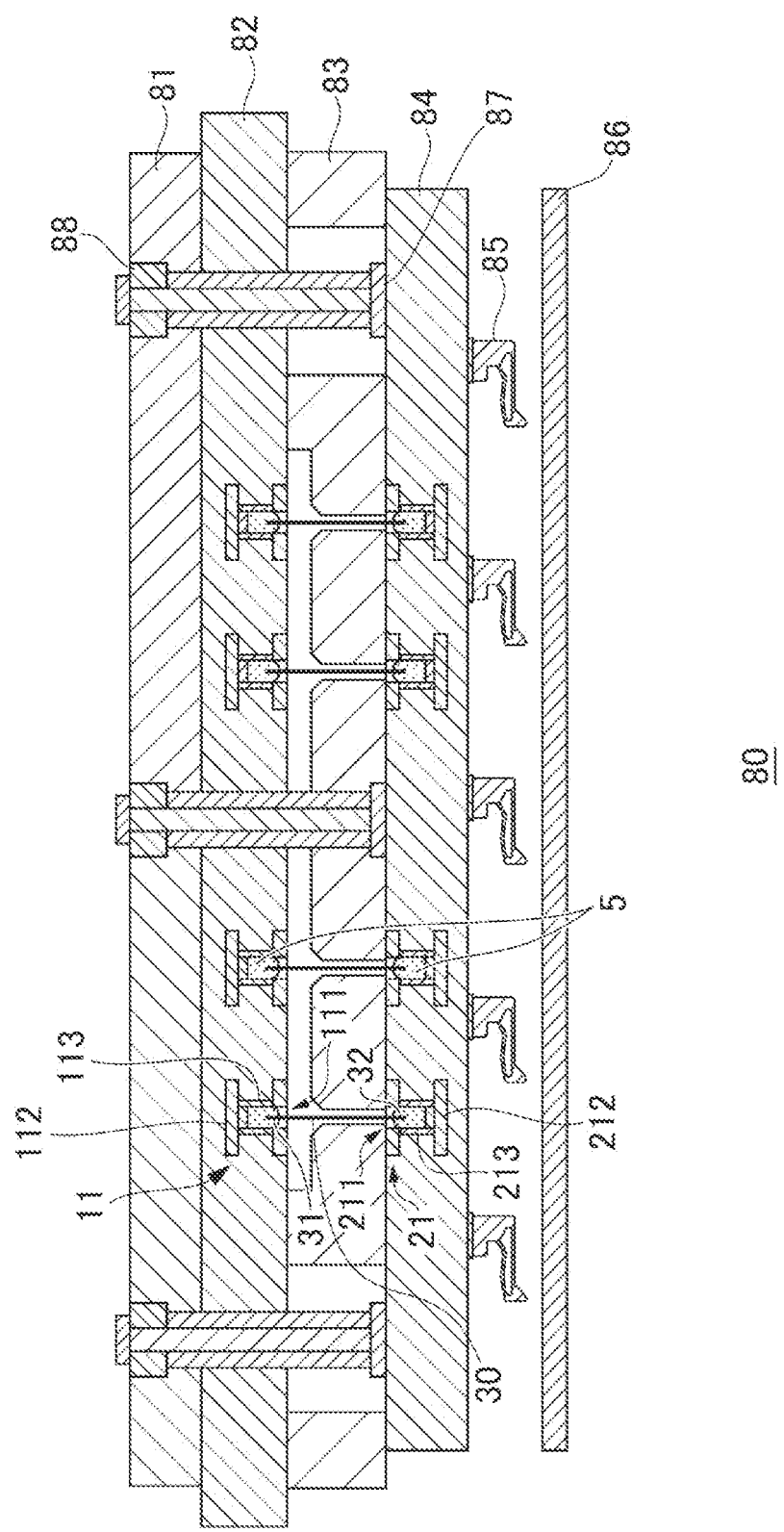
FIG. 2 shows the configuration of a probe card according to a first embodiment.

FIG. 2 shows the configuration of the probe card according to the first embodiment.

Although a probe card 80 in FIG. 2 illustrates main structural members, the probe card 80 is not limited thereto. Actually, structural members not illustrated in FIG. 2 are also provided. In the following, "upper" and "lower" will be referred to by focusing on the vertical direction in FIG. 1.

In FIG. 2, the probe card 80 according to this embodiment includes a flat support member 81, a flat wiring substrate 82 that is retained on a lower surface of the above-described support member 81, an electrical connecting unit 83 to be electrically connected with the above-described wiring substrate 82, and a probe substrate 84 being electrically connected with the above-described electrical connecting unit 83 and having a plurality of electrical contactors (hereinafter, also referred to as the "probes") 85.

The probe card 80 uses multiple fixing members (for example, screwing members such as bolts) when assembling the support member 81, the wiring substrate 82, the electrical connecting unit 83, and the probe substrate 84. However, FIG. 2 does not illustrate these fixing members.

The probe card 80 sets, for example, an integrated circuit that is formed on a wafer, as an inspection object 86, and performs an electrical inspection on the inspection object 86. Specifically, the inspection object 86 is pressed toward the probe substrate 84, and the tip part of each probe 85 on a lower surface of the probe substrate 84 is brought into an electrical contact with an electrode terminal of the inspection object 86. An electrical signal is supplied to the electrode terminal of the inspection object 86 from the inspection device (not illustrated), and the electrical signal from the electrode terminal of the inspection object 86 is given to the inspection device side, thereby performing the electrical inspection on the inspection object 86.

The inspection object 86, which is an inspection target, is placed on an upper surface of a chuck top (not illustrated). The chuck top is capable of adjusting positions in an X-axis direction in the horizontal direction, a Y-axis direction that is vertical to the X-axis direction on a horizontal plane, and a Z-axis direction that is vertical to the horizontal plane (X-Y plane). Furthermore, rotating postures can be adjusted in a e direction around the Z axis.

When performing the electrical inspection on the inspection object 86, a chuck that is capable of elevating in the vertical direction (Z-axis direction) is moved, and the lower surface of the probe substrate 84 of the probe card 80 and the inspection object 86 on the upper surface of the chuck top are moved to become relatively closer in order to bring the electrode terminal of the inspection object 86 into electrical contact with the tip part of each probe 85 of the probe substrate 84.

[Support Member]

The support member 81 suppresses deformation (for example, deflection or the like) of the wiring substrate 82. For example, since the probe substrate 84 has multiple probes 85, the weight of the probe substrate 84 attached to the wiring substrate 82 side is large. In addition, when performing the electrical inspection on the inspection object 86, the probe substrate 84 is pressed against the inspection object 86 such that the tip part of the probe 85 that is projected to the lower surface of the probe substrate 84 contacts the electrode terminal of the inspection object 86. In this manner, at the time of the electrical inspection, a large load is also applied to the wiring substrate 82 due to the action of reaction force (contact load) that is pushed up from bottom to top. The support member 81 functions as a member for suppressing deformation (for example, deflection or the like) of the wiring substrate 82.

In addition, the support member 81 has a plurality of through holes that penetrate the upper surface and the lower surface, and a spacer (support part) 88 is inserted through each through hole, thereby achieving a configuration that is capable of fixing the lower end part of the spacer (support part) 88 and a corresponding anchor 87. In this manner, the probe substrate 84 and the support member 81 can be adjusted in the height direction.

[Wiring Substrate]

The wiring substrate 82 is made of, for example, a resin material such as polyimide, and is, for example, a printed substrate or the like that is formed in a substantially circular plate shape. Multiple electrode terminals (not illustrated) for an electrical connection with a test head (not illustrated) of a tester (inspection device) are disposed in the periphery of the upper surface of the wiring substrate 82.

A wiring pattern is formed on the wiring substrate 82, and the lower surface of the wiring substrate 82 is provided with a plurality of the electrode regions (upper part electrode regions) 11 to be electrically connected with the wiring pattern.

Each electrode region 11 formed on the lower surface of the wiring substrate 82 can have the same configuration as the upper part electrode region 11 illustrated in FIG. 1.

Each electrode region (upper part electrode region) 11 includes the recessed part 111 depressed in the thickness direction on the lower surface of the wiring substrate 82, the metal layer 113 on the inner surface of the recessed part 111, the liquid metal 5 filled in the recessed part 111, and the electrode portion (upper electrode portion) 112 to be electrically connected with the metal layer 113 in the upper bottom part of the recessed part 111. The upper electrode portion 112 is in an electrical connection with the wiring pattern formed on the wiring substrate 82.

The liquid metal 5 is filled in the recessed part 111 of the electrode region 11, and the upper part 31 of each connector 30 in the electrical connecting unit 83 electrically contacts the liquid metal 5 filled in the recessed part 111 of the electrode region 11.

A wiring circuit is formed inside the wiring substrate 82, and the wiring pattern on the lower surface of the wiring substrate 82 and the electrode terminal on the upper surface of the wiring substrate 82 are connectable through the wiring circuit inside the wiring substrate 82. Accordingly, an electrical signal can be conducted between each connector 30 electrically connected with the liquid metal 5 in the electrode region 11 of the wiring pattern on the lower surface of the wiring substrate 82, and the test head connected to the electrode terminal on the upper surface of the wiring substrate 82, through the wiring circuit inside the wiring substrate 82. A plurality of electronic components that are necessary for the electrical inspection of the inspection object 86 are disposed on the upper surface of the wiring substrate 82. Furthermore, in the wiring substrate 82, insertion holes are provided at positions corresponding to the position of each insertion hole provided for the support member 81. The height of the probe card 80 can be adjusted by inserting the spacer 88 into each insertion hole.

[Probe Substrate]

The probe substrate 84 is a substrate having the probes 85, and is formed in a substantially circular shape or polygonal shape (for example, hexadecagon or the like). For example, the probe substrate 84 has a multilayer wiring substrate that is formed with a plurality of wiring substrates. In the probe substrate 84 as a multilayer wiring substrate, a wiring path (not illustrated) is formed among the multilayer substrates. One end of this wiring path is electrically connected with the electrode (lower electrode) 212 of the corresponding wiring pattern on the upper surface of the probe substrate 84, and the other end of the wiring path is electrically connected with the connection terminal of the probes 85 provided on the lower surface of the probe substrate 84.

A plurality of the electrode regions 21 are provided on the upper surface of the probe substrate 84. Each electrode region 21 on the upper surface of the probe substrate 84 can have the same configuration as the lower part electrode region 21 illustrated in FIG. 1.

Each electrode region (lower part electrode region) 21 includes, on the upper surface of the probe substrate 84, the recessed part 211 depressed in the thickness direction, the metal layer 213 on the inner surface of the recessed part 211, the liquid metal 5 filled in the recessed part 211, and the electrode portion (lower electrode portion) 212 to be electrically connected with the metal layer 213 in the lower bottom part of the recessed part 211. The lower electrode portion 212 is electrically connected with the wiring pattern of the probe substrate 84.

In addition, the recessed part 211 of the electrode region 21 is filled with the liquid metal 5, and the lower part 32 of each connector 30 in the electrical connecting unit 83 electrically contacts the liquid metal 5 filled in the recessed part 211 of the electrode region 21.

Accordingly, each probe 85 provided on the lower surface of the probe substrate 84 is electrically connected with the lower electrode 212 of the probe substrate 84 through the wiring path of the probe substrate 84, and is electrically connected with the corresponding electrode region 11 of the wiring substrate 82 through the connector 30 of the electrical connecting unit 83.

[Electrical Connecting Unit]

The electrical connecting unit 83 electrically connects the wiring substrate 82 and the probe substrate 84. The electrical connecting unit 83 is equipped with a plurality of the connectors 30, and the upper part 31 of each connector 30 is brought into electrical contact with the liquid metal 5 of the upper part electrode region 11, and the lower part 32 of each connector 30 is brought into electrical contact with the liquid metal 5 of the lower part electrode region 21, thereby electrically connecting the upper part electrode region 11 and the lower part electrode region 21.

[Electrical Connecting Structure Between Electrode Regions Using Connector]

With reference to FIG. 1, a structure for electrically connecting the electrode region (upper part electrode region) 11 of the wiring substrate 82 with the electrode region (lower part electrode region) 21 of the probe substrate 84 by using the connector 30 will be described.

As exemplified in FIG. 1, by bringing both ends of the connector 30 into contact with the liquid metal 5 provided in the electrode region 11 of the wiring substrate 82 and with the liquid metal 5 in the electrode region 21 of the probe substrate 84, a contact area between the liquid metal 5 and the connector 30 can be expanded, and contact resistance can be suppressed. As a result, an electrical connecting property between the connector 30, and the electrode region 11 and the electrode region 21 can be stabilized.

The states of the upper part electrode region 11 and the lower part electrode region 21 when the liquid metal 5 is filled in the recessed part 111 of the wiring substrate 82 and the recessed part 211 of the probe substrate 84 will now be described.

Although the state of the upper part electrode region 11 of the wiring substrate 82 will be described below, the lower part electrode region 21 of the probe substrate 84 will also become the same state as the upper part electrode region 11, and the same effect can be exerted.

When filling the liquid metal 5 in the recessed part 111 in the upper part electrode region 11 of the wiring substrate 82, in a lower part opening of the recessed part 111, the liquid metal 5 contacts the air, and an oxide film 51 is formed by oxidation of the surface of the liquid metal 5. Since the oxide film 51 has high viscosity, and the value of surface tension of the liquid metal 5 filled in the recessed part 111 is high, movement (dropping) from the recessed part 111 of the liquid metal 5 to the lower part can be suppressed.

Since the liquid metal 5 filled in the recessed part 111 of the wiring substrate 82 is coated with the oxide film 51, the liquid metal 5 existing inside the oxide film 51 is prevented from contacting the air, and thus oxidation, vaporization, and the like of the liquid metal 5 inside the oxide film 51 can be suppressed. Accordingly, conductivity can be secured by bringing the liquid metal 5 inside the oxide film 51 into contact with the connector 30.

When filling the liquid metal 5 in the recessed part 111 in the electrode region 11 of the wiring substrate 82, acid treatment is performed on the surface of the metal layer 113 in order to prevent oxidation of the liquid metal 5 at a contact surface of the metal layer 113 on the inner surface of the recessed part 111 with the liquid metal 5. In this manner, since oxidation of the liquid metal 5 contacting the metal layer 13 can be prevented, an electrical connection between the liquid metal 5, which electrically contacts the connector 30, and the metal layer 113 can be secured. With regard to the acid treatment, for example, a method in which the surface of the metal layer 113 is washed with an acidic solvent can be applied. However, the method of the acid treatment is not limited thereto, and various methods can be widely applied.

[Length of Connector and Length of Distance Between Electrode Regions]

Figure 3:
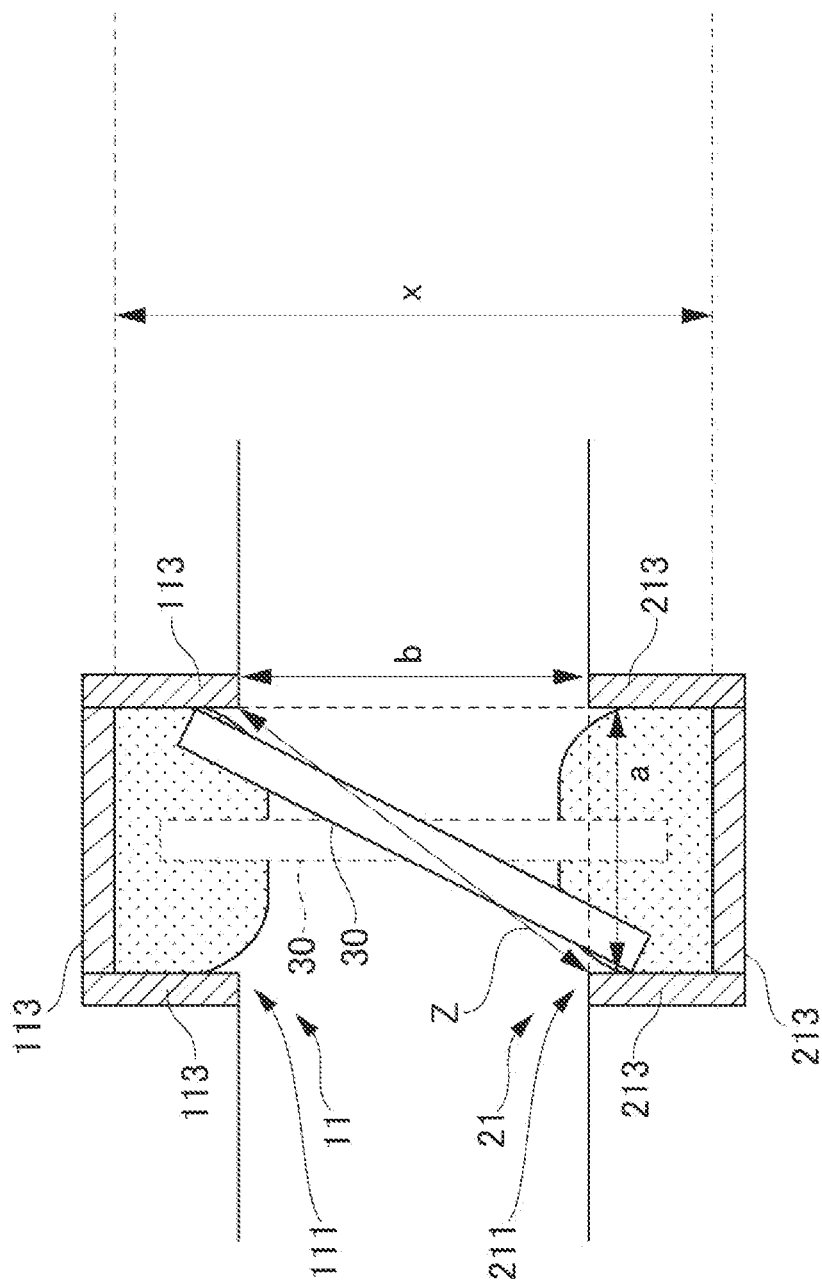
FIG. 3 is an explanatory view for explaining a length of a connector according to the first embodiment.

FIG. 3 is an explanatory view for explaining a length of the connector 30 according to the first embodiment.

The length of the connector 30 for electrically connecting the upper part electrode region 11 of the wiring substrate 82 with the lower part electrode region 21 of the probe substrate 84 can be determined in relation to the length of the distance between the upper part electrode region 11 and the lower part electrode region 21.

In FIG. 3, the length of the distance between the position of the upper bottom part 113 in the metal layer 113 of the recessed part 111 in the upper part electrode region 11 and the position of the lower bottom part 213 in the metal layer 213 of the recessed part 211 in the lower part electrode region 21 (hereinafter, also referred to as the "length of the distance between the electrode regions") is denoted "X". At this time, when the full length of the connector 30 is denoted "Y", the full length Y of the connector 30 can be made smaller than the distance length X (X>Y).

In this manner, by setting the full length of the connector 30 smaller than the length of the distance between the electrode regions, the upper part 31 and the lower part 32 of the connector 30 contacts the inner liquid metal 5 coated with the oxide film 51, and receives buoyancy from each liquid metal 5, and the connector 30 can be in a floatable state.

In addition, when the connector 30 is in a floated state by receiving buoyancy of the liquid metal 5 of the upper part electrode region 11 and the lower part electrode region 21, the connector 30 may fall down. Thus, the full length of the connector 30 is desirably set to a length that is supported by the inner surfaces of the recessed part 111 and the recessed part 211 in the upper part electrode region 11 and the lower part electrode region 21.

Furthermore, as illustrated in FIG. 3, if the recessed part 111 in the upper part electrode region 11 and the recessed part 211 in the lower part electrode region 21 have the same shapes, and the recessed part 111 and the recessed part 211 are in positions opposing in the vertical direction, when the diameter of the recessed part 111 (or the recessed part 211) is denoted "a" and the length of the distance between the position of the opening part of the recessed part 111 and the position of the opening part of the recessed part 211 is denoted "b", the full length Y of the connector 30 can be set to distance length $Z(=(a^2+b^2)^{1/2})$ and over (Y≥Z). In this manner, even if the connector 30 collapses, the connector 30 can be prevented from falling down since the end part of the connector 30 will contact the inner surfaces of the recessed part 111 and the recessed part 211.

As described above, by at least setting the full length of the connector 30 smaller than the length of the distance between the electrode regions, both ends of the connector 30 can be brought into contact with the liquid metal 5 of each electrode region 11, 12, and the connector 30 can float in a state receiving buoyancy from the liquid metal 5. As a result, an electrical connection between the upper part electrode region 11 and the lower part electrode region 21 can be performed in a state in which the liquid metal 5 of the upper part electrode region 11 and the lower part electrode region 21 is in electrical contact with the connector 30.

The recessed part 111 in the upper part electrode region 11 and the recessed part 211 in the lower part electrode region 21 may have shapes that are depressed in a column shape, prism shape, truncated pyramid, or the like, in the thickness direction of the substrate. In addition, the thickness length of the recessed part 111 and the recessed part 211 in the thickness direction of the substrate may be determined as appropriate in accordance with the operation.

[End Part Shape of Connector]

Figure 4:
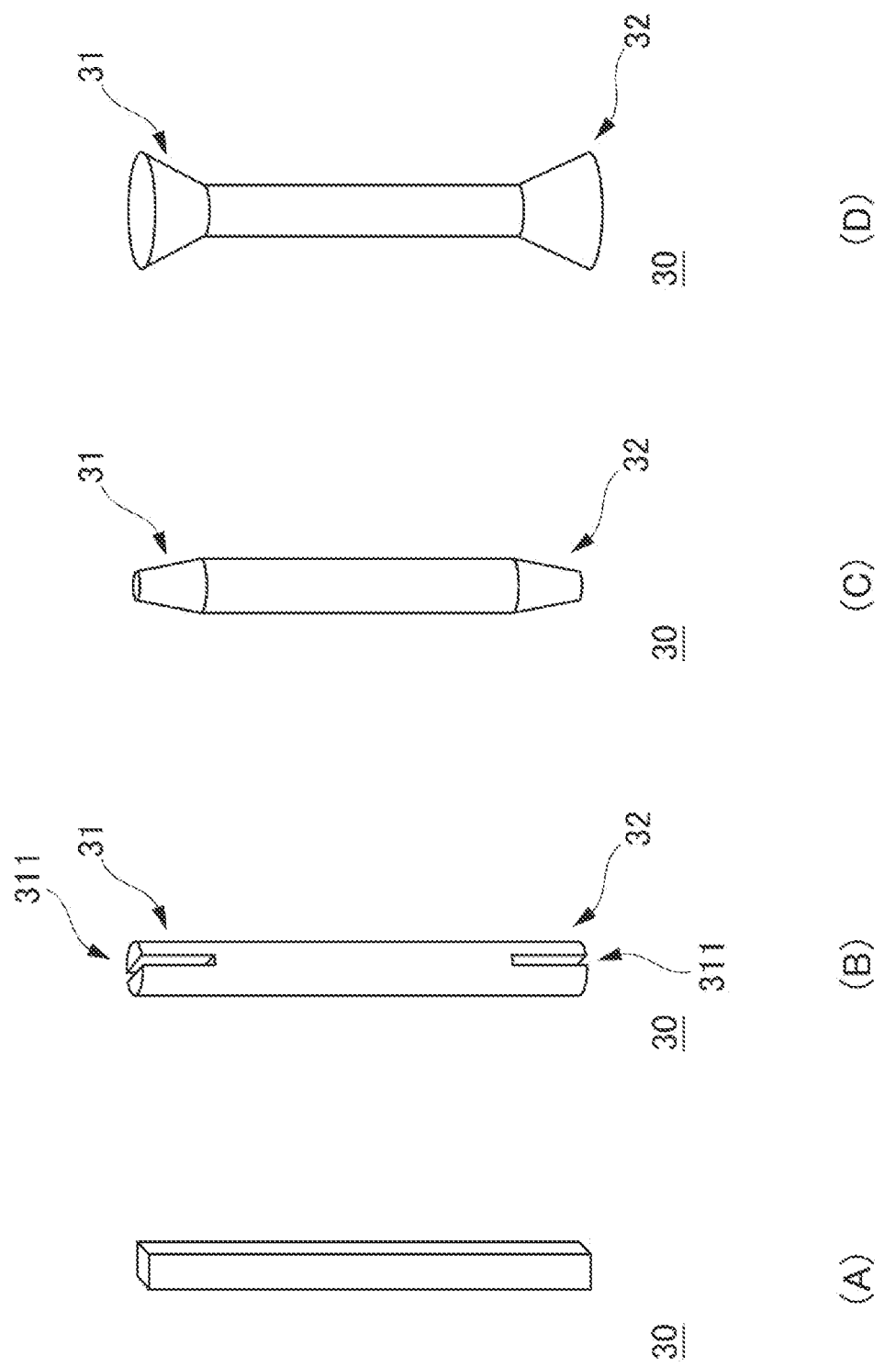
FIG. 4 illustrates a shape example of the connector according to the first embodiment.

FIG. 4 illustrates a shape example of the connector 30 according to the first embodiment.

The end part of the connector 30 may have a contact expanding shape part that expands contact with the liquid metal 5. This contact expanding shape part is a shape part in which parts among the connector 30 to be brought into contact with the liquid metal 5 are processed such that a contact area with the liquid metal 5 is expanded. For example, shape parts as illustrated in FIG. 4(B) to FIG. 4(D) can be applied.

The shapes of both end parts of the connector 30 may be processed, or the shape of either one of both end parts may be processed. Furthermore, the shapes of both end parts of the connector 30 may be processed to have the same shape, or both end parts may be processed in different shapes.

The cross-sectional shape of the connector 30 may be in, for example, a circle shape, an oval shape, a square, a polygon, or the like. In addition, various shapes can be used for the shape of the connector 30, and the shape is not limited to those illustrated in FIG. 3(A) to FIG. 3(D).

FIG. 4(A) illustrates a case of a rod-like member in which the cross-sectional shape of the connector 30 is a square. According to the connector 30 illustrated in FIG. 4(A), the electrical connecting property between the upper part electrode region 21 and the lower part electrode region 21 can be stabilized while simplifying the shape of the connector 30. The cross-sectional shape of the connector 30 may be in, for example, a circle shape, an oval shape, a polygon, or the like.

FIG. 4(B) illustrates a case in which each of the upper part 31 and the lower part 32 of the connector 30 is provided with a slit part (groove part) 311. As illustrated in FIG. 4(B), by providing the slit part 311 for the upper part 31 and the lower part 32 of the connector 30, a wall surface of the slit part 311 also contacts the liquid metal 5. Thus, the contact area between the liquid metal 5 and the connector 30 can be further expanded, and good electrical connecting property between the connector 30 and the liquid metal 5 can be achieved.

As long as a configuration in which the contact area between the connector 30 and the liquid metal 5 is expanded is achieved, a plurality of the slit parts 311 may be provided for the upper part 31 and the lower part 32 of the connector 30. In addition, instead of the slit part 311, one or a plurality of through holes or one or a plurality of non-penetrating hole parts (recessed parts) may be provided, or one or a plurality of protruding parts may be provided. Although FIG. 4(B) illustrates a case in which the cross-sectional shape of the connector 30 is a circle shape, the cross-sectional shape of the connector 30 may be an oval shape, a square, a polygon, or the like.

FIG. 4(C) illustrates a case in which each of the upper part 31 and the lower part 32 of the connector 30 is formed in a conical shape or a square pyramid shape having a flat tip. In other words, the upper part 31 and the lower part 32 of the connector 30 have tapered shapes in which the diameter becomes narrower towards the tip side. As shown in FIG. 4(C), by forming the upper part 31 and the lower part 32 of a connector 30 in a spindle shape, the oxide film 51 formed on the surface of the liquid metal 5 can be broken, and contact with the liquid metal 5 can be realized. In addition, since the tip of the spindle shape is flat, the connector 30 is easily floatable by receiving buoyancy of the liquid metal 5.

FIG. 4(D) illustrates a case in which each of the upper part 31 and the lower part 32 of the connector 30 has a tapered shape in which the diameter becomes larger towards the tip side. In this manner, the upper part 31 and the lower part 32 of the connector 30 easily receive buoyancy from the liquid metal 5, and due to a surface tension of the liquid metal 5, the connector 30 can retain a stable posture (i.e., in the case of FIG. 1, a standing posture in the vertical direction). In addition, the contact area between the connector 30 and the liquid metal 5 can be expanded. As a result, the electrical connecting property between the upper part electrode region 11 and the lower part electrode region 21 can be stabilized.

(B-3) Effect of First Embodiment

As described above, according to the first embodiment, by bringing both ends of the connector into contact with the liquid metals in the electrode region of the wiring substrate and in the electrode region of the probe substrate, a contact area between the liquid metal and the connector can be expanded, and contact resistance can be suppressed. As a result, an electrical connecting property between the connector and the electrode regions can be stabilized.

In addition, according to the first embodiment, by characterizing the shape, the length, and the like of the connector, the connector can be brought into contact with the liquid metal in a state receiving buoyancy of the liquid metals of the electrode regions. Accordingly, a stable electrical connecting property can be retained even if variations may occur in the length of the distance between the electrode regions.

(C) Other Embodiment

Although various modified embodiments were referred to also in the embodiment described above, the present disclosure can also be applied to the following modified embodiments.

(C-1) Although application of the electrical connecting structure between the electrode regions described above to a probe card is illustrated, the electrical connecting structure between the electrode regions described in the basic concept can be applied to a circuit device for electrically connecting electrode regions (electrode portions) of a wiring substrate.

For example, the circuit device may be used for, for example, a circuit device to be equipped in a device, equipment, or the like such as a personal computer. Even when the electrical connecting structure between the electrode regions described in the basic concept is applied to such circuit device, a contact area with the connector is expanded and contact resistance can be suppressed, and thus a stable electrical connecting property can be maintained. In addition, even when the electrical connecting structure between the electrode regions described in the basic concept is applied to the circuit device, the length, the shape, and the like of the connector may be those described in FIG. 2 and FIG. 3, and the same effect can be exerted.

Figure 5:
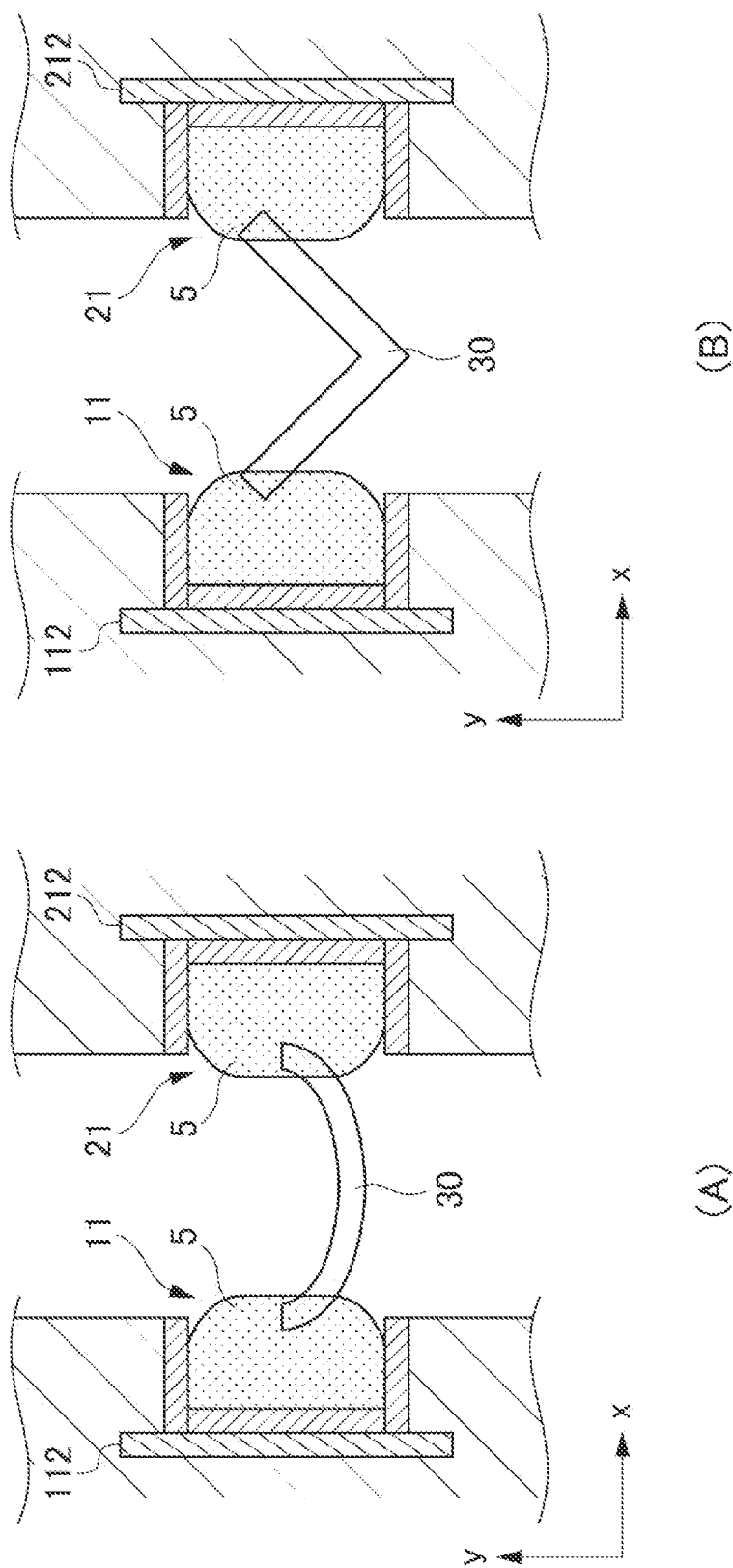
FIG. 5 shows the configuration of an electrical connecting structure between electrode regions of a wiring substrate in an electrical connecting apparatus according to a modified embodiment.
Figure 6:
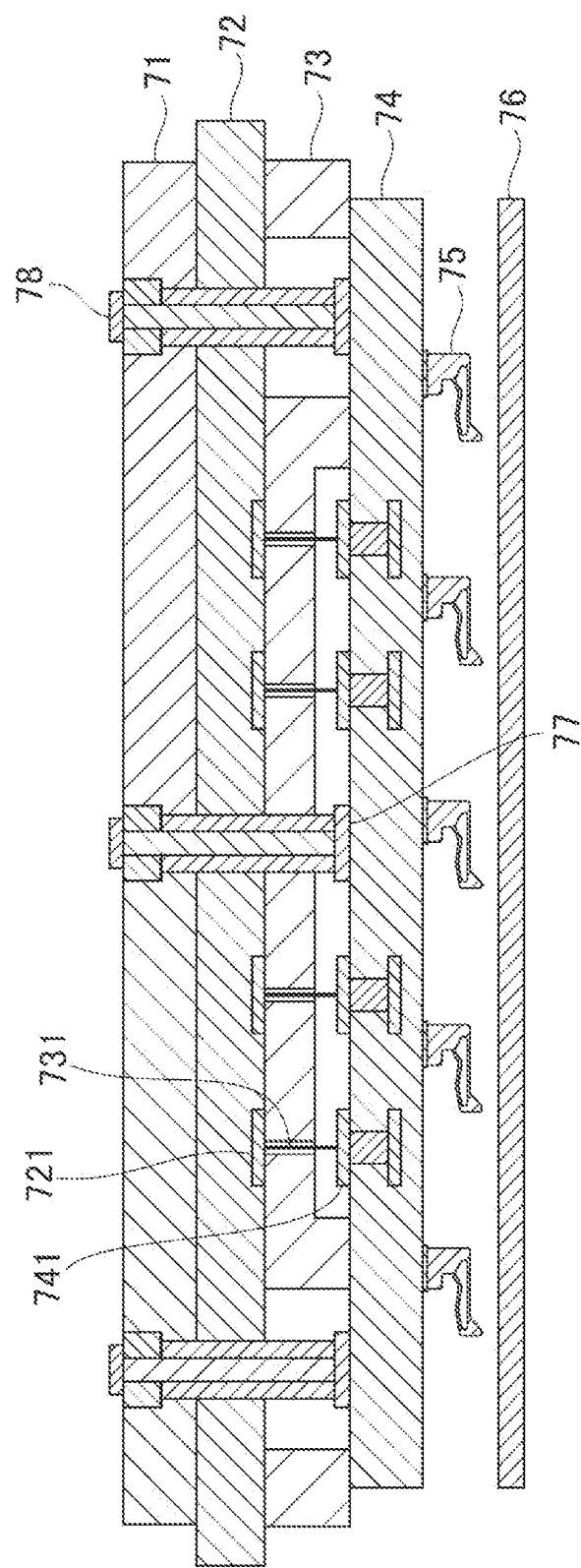
FIG. 6 shows the configuration of an electrical connecting apparatus of the prior art.

(C-2) The basic concept and the first embodiment described above illustrate a case in which the electrode regions to be electrically connected using the connector are provided in the vertical direction. As illustrated in FIG. 5, application can be made also to a case in which the electrode regions are provided in the horizontal direction. In that case, the shape of the connector 30 may be that illustrated in FIG. 3, or may be a shape in which both ends of the connector 30 can float in the liquid metal 5 of the two electrode regions 11 and 12. For example, as illustrated in FIG. 5(A), the connector 30 may be a member having an arc-like shape or a substantially U-shape that is downwardly convex. Furthermore, as illustrated in FIG. 5(B), the connector 30 may be a member having a substantially V-shape. The same effect can be exerted also in this case.

REFERENCE SIGNS LIST 1 electrical connecting structure
80 probe card
81 support member
82 wiring substrate
83 electrical connecting unit
84 probe substrate
85 electrical contactor
86 inspection object
10 first wiring substrate
11 electrode region
12 lower surface of the first wiring substrate
13 electric circuit
111 recessed part
112 electrode portion (upper electrode portion)
113 metal layer
20 second wiring substrate
21 electrode region of 20
22 upper surface of the second wiring substrate
23 electric circuit
211 recessed part
212 electrode portion (lower electrode portion)
213 metal layer
30 connector

The invention claimed is:

1. An electrical connecting apparatus characterized in comprising:
   a first electrode region in which a liquid metal is filled in a first recess of a first recessed part that is capable of conducting with a substrate electrode of a first wiring substrate;
   a second electrode region in which a liquid metal is filled in a second recess of a second recessed part that is capable of conducting with a substrate electrode of a second wiring substrate opposing the first wiring substrate; and
   a connector that causes conduction between the first electrode region and the second electrode region by bringing one end part into contact with the liquid metal of the first electrode region and bringing the other end part into contact with the liquid metal of the second electrode region,
   wherein the liquid metal in each of the first electrode region and the second electrode region is held in each of the first recess and the second recess by a surface tension of an oxide film on a surface of the liquid metal,
   wherein both end parts of the connector that contact the liquid metal are floating,
   wherein both end parts or one of the end parts of the connector have a tapered shape whose diameter is larger towards a tip side to expand a contact area between the connector and the liquid metal and enable the connector to retain a stable posture due to said surface tension, and
   wherein the first electrode region is positioned directly above the second electrode region.

2. The electrical connecting apparatus according to claim 1, characterized in that a length of the connector is smaller than the length of a distance between a bottom part of the first recessed part and a bottom part of the second recessed part in which the liquid metal is filled.

3. The electrical connecting apparatus according to claim 1, characterized in that both end parts of the connector contacting the liquid metal are floating.

4. The electrical connecting apparatus according to claim 1, wherein both end parts or one of the end parts of the connector is provided with a slit part, the slit part including a slit having a wall surface that also contacts the liquid metal to expand a contact area between the connector and the liquid metal.

5. The electrical connecting apparatus according to claim 1, wherein the connector is a substantially U-shaped member or a substantially V-shaped member, and
  both ends of the connector that come into contact with the liquid metal in each of the first electrode region and the second electrode region are floating.

* * * * *